(12) United States Patent
Pancholi et al.

(10) Patent No.: US 12,444,707 B2
(45) Date of Patent: Oct. 14, 2025

(54) METHOD FOR COLLECTIVE DISHING OF SINGULATED DIES

(71) Applicant: Applied Materials, Inc., Santa Clara, CA (US)

(72) Inventors: Anup Pancholi, Hillsboro, OR (US); Marvin Louis Bernt, Whitefish, MT (US); Vincent Dicaprio, Pleasanton, CA (US); Ronald Patrick Huemoeller, Gilbert, AZ (US)

(73) Assignee: Applied Materials Inc., Santa Clara, CA (US)

( * ) Notice: Subject to any disclaimer, the term of this patent is extended or adjusted under 35 U.S.C. 154(b) by 541 days.

(21) Appl. No.: 17/992,167

(22) Filed: Nov. 22, 2022

(65) Prior Publication Data

US 2024/0170452 A1  May 23, 2024

(51) Int. Cl.
 H01L 23/00 (2006.01)
 H01L 21/304 (2006.01)
 H01L 21/56 (2006.01)
 H01L 21/683 (2006.01)

(52) U.S. Cl.
 CPC ............ H01L 24/97 (2013.01); H01L 21/304 (2013.01); H01L 21/568 (2013.01); H01L 21/6835 (2013.01); H01L 24/80 (2013.01); H01L 2224/80895 (2013.01); H01L 2224/80896 (2013.01); H01L 2224/97 (2013.01)

(58) Field of Classification Search
 CPC ..... H01L 24/97; H01L 21/304; H01L 21/568; H01L 21/6835; H01L 24/80; H01L 2224/80895; H01L 2224/80896; H01L 2224/97; H01L 2221/68327; H01L 2221/68354; H01L 2221/68368; H01L 21/561; H01L 24/08; H01L 24/96
 USPC ........................................................ 438/107
 See application file for complete search history.

(56) References Cited

U.S. PATENT DOCUMENTS

| | | | | |
|---|---|---|---|---|
| 9,373,604 | B2 * | 6/2016 | Yu .......................... | H01L 23/481 |
| 9,524,959 | B1 * | 12/2016 | Yeh ....................... | H01L 23/5226 |
| 10,141,276 | B2 * | 11/2018 | Hsu ...................... | H01L 21/6835 |
| 10,312,220 | B2 * | 6/2019 | Hiner ..................... | H01L 24/97 |
| 10,818,570 | B1 * | 10/2020 | England ................ | H01L 23/367 |

(Continued)

FOREIGN PATENT DOCUMENTS

CN   113990842 A   1/2022

OTHER PUBLICATIONS

International Search Report for PCT/US2023/031110, dated Dec. 15, 2023.

*Primary Examiner* — Vu A Vu
(74) *Attorney, Agent, or Firm* — Moser Taboada

(57) ABSTRACT

Methods for substrate processing include attaching a plurality of dies to a first carrier, wherein each die has a first side and a second side opposite the first side, wherein the first side is attached to the first carrier and wherein the plurality of dies are spaced horizontally from one another on the first carrier; filling spaces between the plurality of dies and covering the second sides of the plurality of dies with a dielectric or metal; grinding or polishing the dielectric or metal covering the second sides and grinding or polishing the second sides until the second sides are exposed and the plurality of dies have a substantially uniform thickness; and after grinding or polishing, dishing die faces of the plurality of dies to a desired dishing profile.

20 Claims, 6 Drawing Sheets

(56) References Cited

U.S. PATENT DOCUMENTS

| | | |
|---|---|---|
| 11,069,734 B2 | 7/2021 | Katkar |
| 11,145,626 B2* | 10/2021 | Hwang .................... H01L 25/18 |
| 11,355,358 B2 | 6/2022 | See et al. |
| 11,552,041 B2* | 1/2023 | Fountain, Jr. ............ H01L 24/32 |
| 11,955,444 B2* | 4/2024 | Arumugam ............. H01L 24/08 |
| 11,966,831 B2* | 4/2024 | Hawkins ................ G06N 3/045 |
| 12,033,978 B2* | 7/2024 | Shih ........................ H01L 24/19 |
| 2004/0084414 A1* | 5/2004 | Sakai ....................... C23F 3/00 |
| | | 216/88 |
| 2008/0197367 A1 | 8/2008 | Cai et al. |
| 2021/0111150 A1 | 4/2021 | Liu |
| 2021/0217726 A1* | 7/2021 | Yu ........................... H01L 24/32 |
| 2022/0199560 A1 | 6/2022 | Haba et al. |
| 2022/0254746 A1 | 8/2022 | Enquist |
| 2023/0332017 A1* | 10/2023 | Hong ....................... C09G 1/02 |

\* cited by examiner

METHOD FOR COLLECTIVE DISHING OF SINGULATED DIES

FIELD

Embodiments of the present disclosure generally relate to substrate processing methods, and more particularly, to methods for collectively dishing a plurality of dies.

BACKGROUND

In semiconductor manufacturing, a die is the area of the silicon wafer on which a functional circuit is fabricated. Many hundreds of identical dies can be fabricated on each wafer. Chemical mechanical planarization (CMP) is usually performed on an entire wafer before wafer dicing and die singulation. However, there is often thickness variations from wafer to wafer. As a result of such thickness variation, for multi-die packages comprised of dies from different wafers, dies are often attached (e.g., hybrid bonded) to a substrate one at a time. Such sequential processing increases handling steps and process time.

Also, each semiconductor wafer goes through pre-treatment processing (e.g., cleaning, plasma, hydration). Thus, all of the dies on a wafer are pre-treated together usually after dicing on a film frame, making queue time control a challenge for multi-die packages where dies come from different diced wafers.

Thus, as described in greater detail herein, the inventors provide novel methods for processing substrates allowing for collective planarization and dishing of dies and collective attachment of dies to a substrate. Collective attachment of dies may reduce handling steps and process time, as well as improve process control.

SUMMARY

Methods of substrate processing are provided herein. In some embodiments, a method of substrate processing include attaching a plurality of dies to a first carrier, wherein each die has a first side and a second side opposite the first side, wherein the first side is attached to the first carrier and wherein the plurality of dies are spaced horizontally from one another on the first carrier; filling spaces between the plurality of dies and covering the second sides of the plurality of dies with a dielectric or metal; grinding or polishing the dielectric or metal covering the second sides and grinding or polishing the second sides until the second sides are exposed and the plurality of dies have a substantially uniform thickness; and after grinding or polishing, dishing die faces of the plurality of dies to a desired dishing profile.

In some embodiments, a method of substrate processing includes attaching a plurality of dies face down to a first carrier, and wherein the plurality of dies are spaced horizontally from one another on the first carrier; filling spaces between the plurality of dies and covering backs sides of the plurality of dies with a dielectric or metal; grinding or polishing the dielectric or metal covering the back sides of the plurality of dies and grinding or polishing the back sides of the plurality of dies until the back sides are exposed and the plurality of dies have a substantially uniform thickness; after grinding or polishing, attaching a second carrier to the back sides of the plurality of dies and detaching the first carrier exposing the die faces of the plurality of dies; dishing the die faces of the plurality of dies to a desired dishing profile; and after dishing the die faces, removing the dielectric or metal between at least one space between the plurality of dies.

In other embodiments, a method of substrate processing includes attaching a plurality of dies face up to a first carrier, and wherein the plurality of dies are spaced horizontally from one another on the first carrier; filling spaces between the plurality of dies and covering faces of the plurality of dies with a dielectric or metal; grinding or polishing the dielectric or metal covering the die faces of the plurality of dies and grinding or polishing the die faces of the plurality of dies until the die faces are exposed and all of the dies have a substantially uniform thickness; after grinding or polishing, dishing the die faces of the plurality of dies to a desired dishing profile; and after dishing the die faces, removing the dielectric or metal between at least one space between the plurality of dies.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
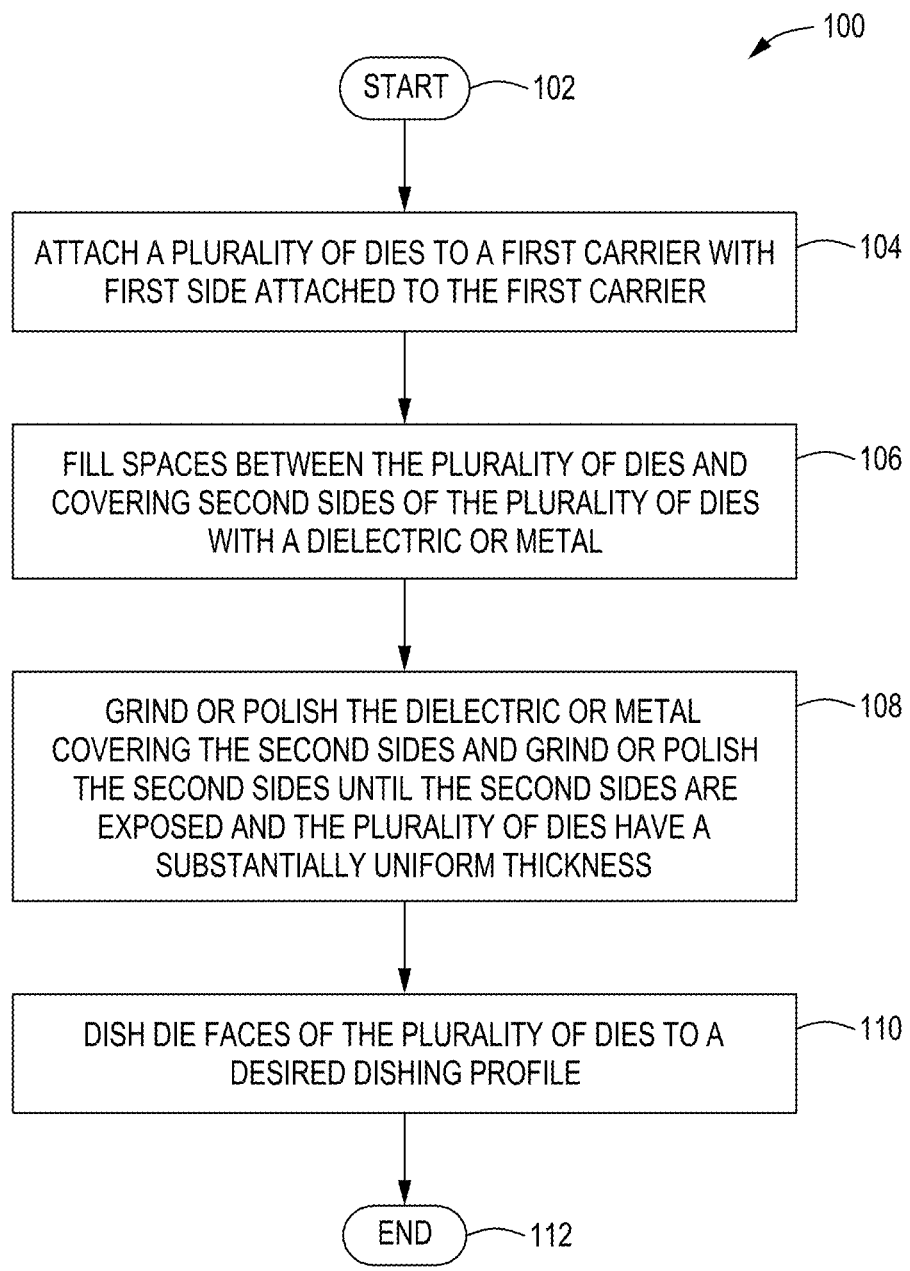
FIG. 1 is a flow diagram of a method of substrate processing in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method of substrate processing are provided herein. The methods for processing substrates described herein allow for collective planarization and dishing of dies and collective attachment of a plurality of dies to a substrate. The methods described herein allow for improved thickness control of a plurality of dies packaged together on a substrate, as well as improved dishing control to improve die bonding. Moreover, the methods described herein allow package level collective die-to-substrate bonding, which can reduce the number of handling steps compared to sequential die-to-substrate bonding.

FIG. 1 is a flow diagram of a method 100 of substrate processing in accordance with embodiments of the present disclosure. In some embodiments the method may start at 102 by providing singulated dies from one or more substrates. For example, in some embodiments, one or more substrates may be provided, sorted, and diced.

In some embodiments, at 104 a plurality of dies may be attached to a first carrier. In some embodiments, the plurality of dies attached to the first carrier may include dies singulated from different substrates. In some embodiments, the plurality of dies attached to the first carrier may be from the same substrate. In some embodiments, the first carrier may be made of silicon or glass and the dies may be adhesively attached to the first carrier. Each die may have a first side and a second side opposite the first side, where the first side is attached to the first carrier, and the plurality of dies may be spaced horizontally from one another on the first carrier. For example, the dies may have a face on the first side or the second side so in some embodiments, the dies may be attached face up or face down on the first carrier, as discussed in greater detail below.

In some embodiments, at 106 spaces between the plurality of dies may be filled with a dielectric and the second sides of the plurality of dies may be covered with a dielectric. In some embodiments, the spaces between the plurality of dies may be filled with metal and the second sides of the plurality of dies may be covered with metal, for example, to facilitate heat dissipation and shielding. In some embodiments, such filling may include molding, depositing, or coating the dielectric or metal. In some embodiments, the dielectric may include at least one of a polymer, an oxide, or a nitride.

In some embodiments, at 108 the dielectric or metal covering the second sides may be ground or polished and the second sides may be ground or polished until the second sides are exposed and the plurality of dies have a substantially uniform thickness. In some embodiments, at 110 after grinding or polishing, die faces of the plurality of dies may be dished to a desired dishing profile to prepare the plurality of dies for attachment to a substrate, such as by hybrid bonding. The plurality of dies may be collectively dished in a CMP process to achieve the desired dishing profile. Thus, in some embodiments at the end 112 of the method 100, a plurality of dies are prepared to be collectively attached to a substrate, such as by hybrid bonding. As discussed above, collective die-to-substrate bonding with controlled thickness and dishing for dies may advantageously reduce the number of handling steps and reduce process time. Also, the method 100 may improve process and defect control by allowing for fewer handling steps after die singulation.

Figure 2:
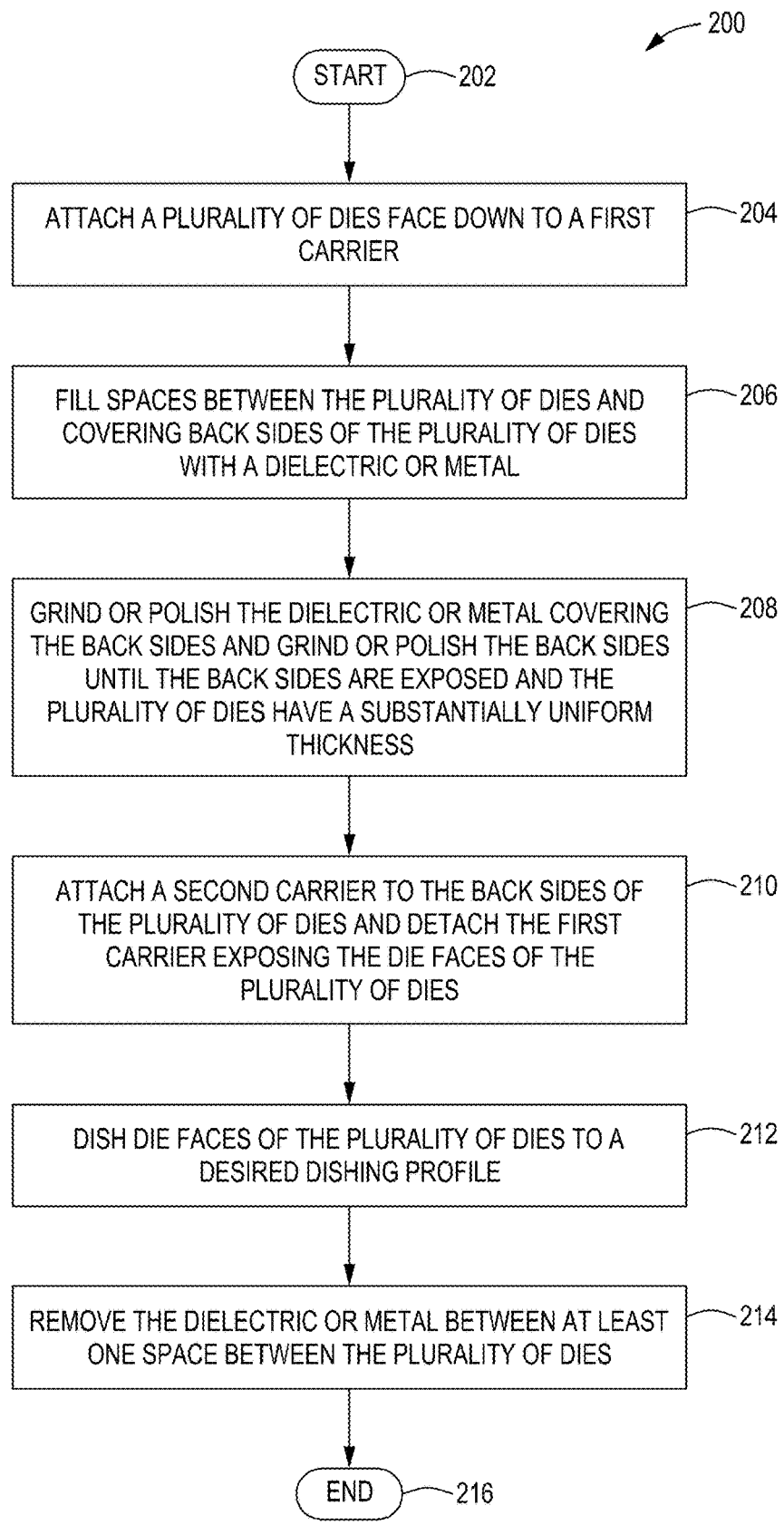
FIG. 2 is a flow diagram of a method of substrate processing in accordance with embodiments of the present disclosure.
Figure 3A:
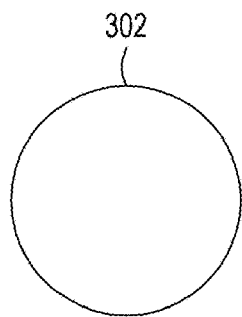
FIGS. 3A-3G include schematics illustrating steps of the method of FIG. 2.
Figure 3B:
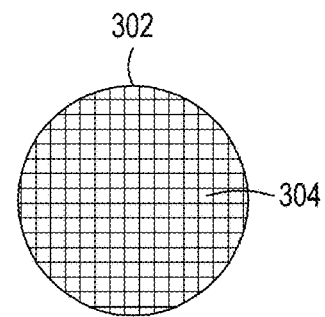

FIG. 2 is a flow diagram of another method 200 of substrate processing in accordance with embodiments of the present disclosure. In some embodiments the method may start at 202 by providing one or more substrates 302, sorting the substrates, and dicing the substrates into singulated dies 304 as shown, for example, in FIGS. 3A and 3B.

Figure 3C:
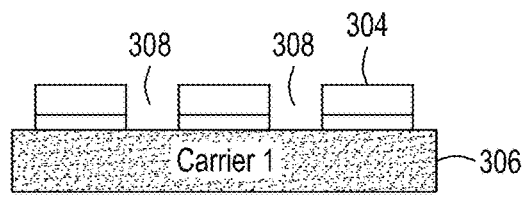

In some embodiments, at 204 a plurality of dies 304 may be attached face down to a first carrier 306, as shown for example in FIG. 3C. In some embodiments, the plurality of dies 304 attached to the first carrier 306 may include dies singulated from different substrates 302. In some embodiments, the plurality of dies 304 attached to the first carrier 306 may be from the same substrate 302. In some embodiments, the first carrier 306 may be made of silicon or glass and the dies 304 may be adhesively attached to the first carrier 306. The plurality of dies 304 may be spaced horizontally from one another on the first carrier 306 leaving spaces 308 between dies 304 as shown, for example, in FIG. 3C.

Figure 3D:
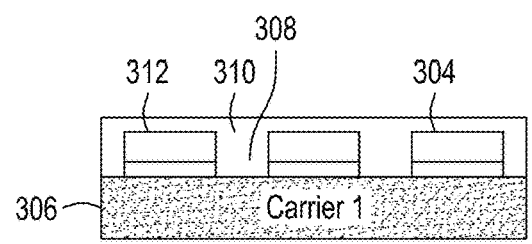

In some embodiments, at 206 the spaces 308 between the plurality of dies 304 may be filled with a dielectric or metal 310 and the back sides 312 of the plurality of dies 304 may be covered with the dielectric or metal 310, as shown for example in FIG. 3D. In some embodiments, filling may include molding, depositing, or coating the dielectric or metal 310. Also, in some embodiments, the dielectric 310 may include at least one of a polymer, a oxide, or a nitride.

Figure 3E:
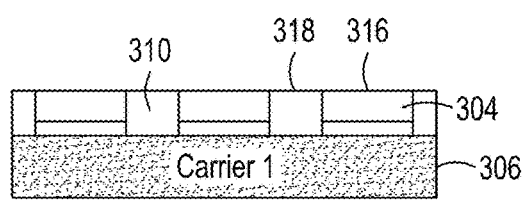
Figure 3F:
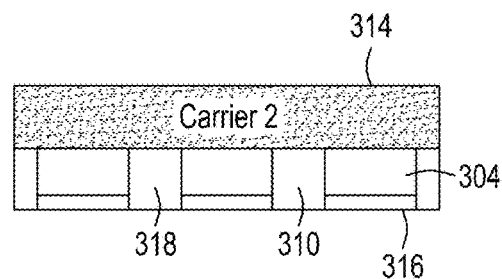
Figure 3G:
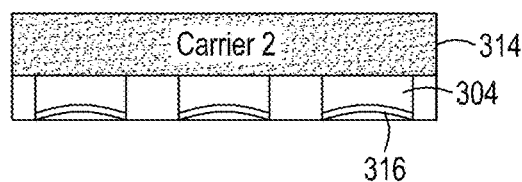

In some embodiments, at 208 the dielectric or metal 310 covering the back sides 312 may be ground or polished and the back sides 312 may be ground or polished until the back sides 312 are exposed and the plurality of dies 304 have a substantially uniform thickness, as shown for example at FIG. 3E. In some embodiments, at 210 a second carrier 314 may be attached to the back sides 312 (as well as exposed sides 318 of the dielectric or metal 310) of the plurality of dies 304 and the first carrier 306 may be detached from the die faces 316 of the plurality of dies 304 to expose the die faces 316, as shown in FIG. 3F. In some embodiments, after detaching the first carrier 306, the die faces 316 of the plurality of dies 304 may be dished to a desired dishing profile to prepare the plurality of dies 304 for attachment, such as by hybrid bonding. The plurality of dies 304 may be dished in a CMP process to achieve the desired dishing profile, as shown for example at FIG. 3G.

Figure 4:
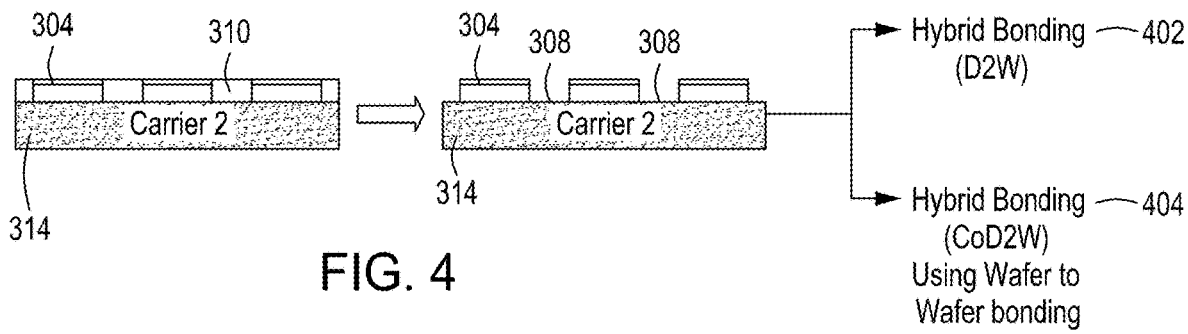
FIGS. 4 and 5 show removal of dielectric or metal and hybrid bonding in accordance with embodiments of the present disclosure.
Figure 5:
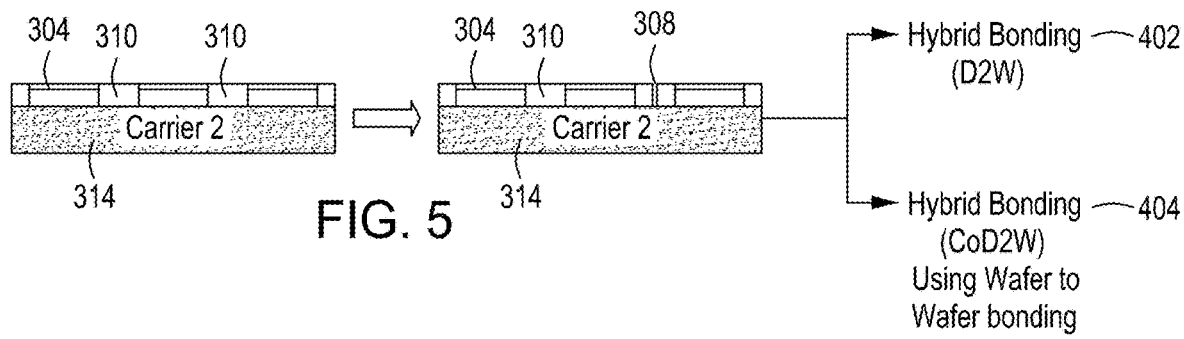

After dishing the plurality of dies 304, at 214 dielectric or metal 310 may be removed from at least one space 308 between the plurality of dies 304, as shown for example in FIGS. 4 and 5. For example, FIG. 4 shows an embodiment where the dielectric or metal 310 between all of the spaces 308 is removed and FIG. 5 shows an embodiment where the dielectric or metal 310 is not removed from all of the spaces 308. The method may end at 216 whereupon further processing may take place.

For example, in some embodiments, subsequent to the end of the method 200 at 216, the plurality of dies 304 may be collectively attached to a substrate 602, such as by hybrid bonding. For example, FIGS. 4 and 5 show embodiments where the plurality of dies 304 are hybrid bonded by die-to-wafer (D2 W) bonding 402 or collective die-to-wafer (CoD2 W) bonding 404.

Figure 6:
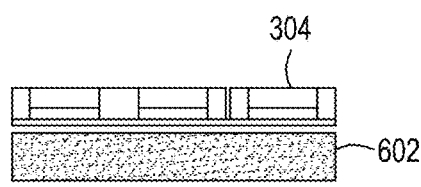
FIGS. 6 and 7 show a plurality of dies collectively attached to a substrate in accordance with embodiments of the present disclosure.
Figure 7:
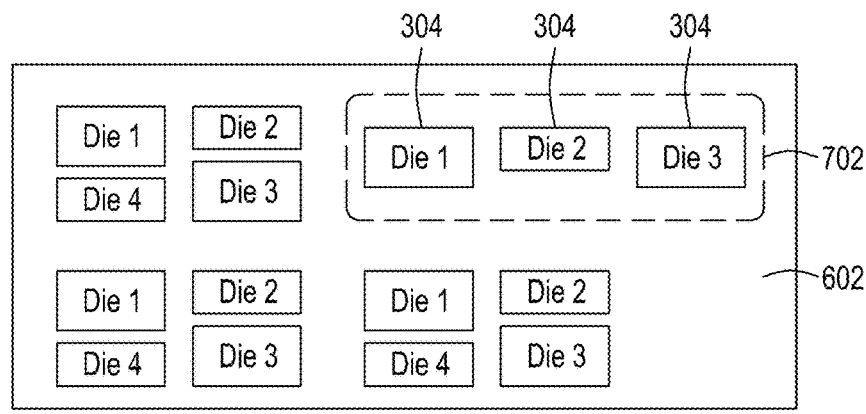

According to some embodiments, and as shown in FIG. 6, the plurality of dies 304 shown in the embodiment of FIG. 5 may be hybrid bonded to a substrate 602. As shown in FIG. 6, the plurality of dies 304 are collectively hybrid bonded to the substrate 602 and the second carrier 314 is detached from the plurality of dies 304. In some embodiments, and as shown in FIG. 7, the bonded plurality of dies 304 may comprise a portion of a die package 702 attached to the substrate 602, which may be a circuit board.

Figure 8:
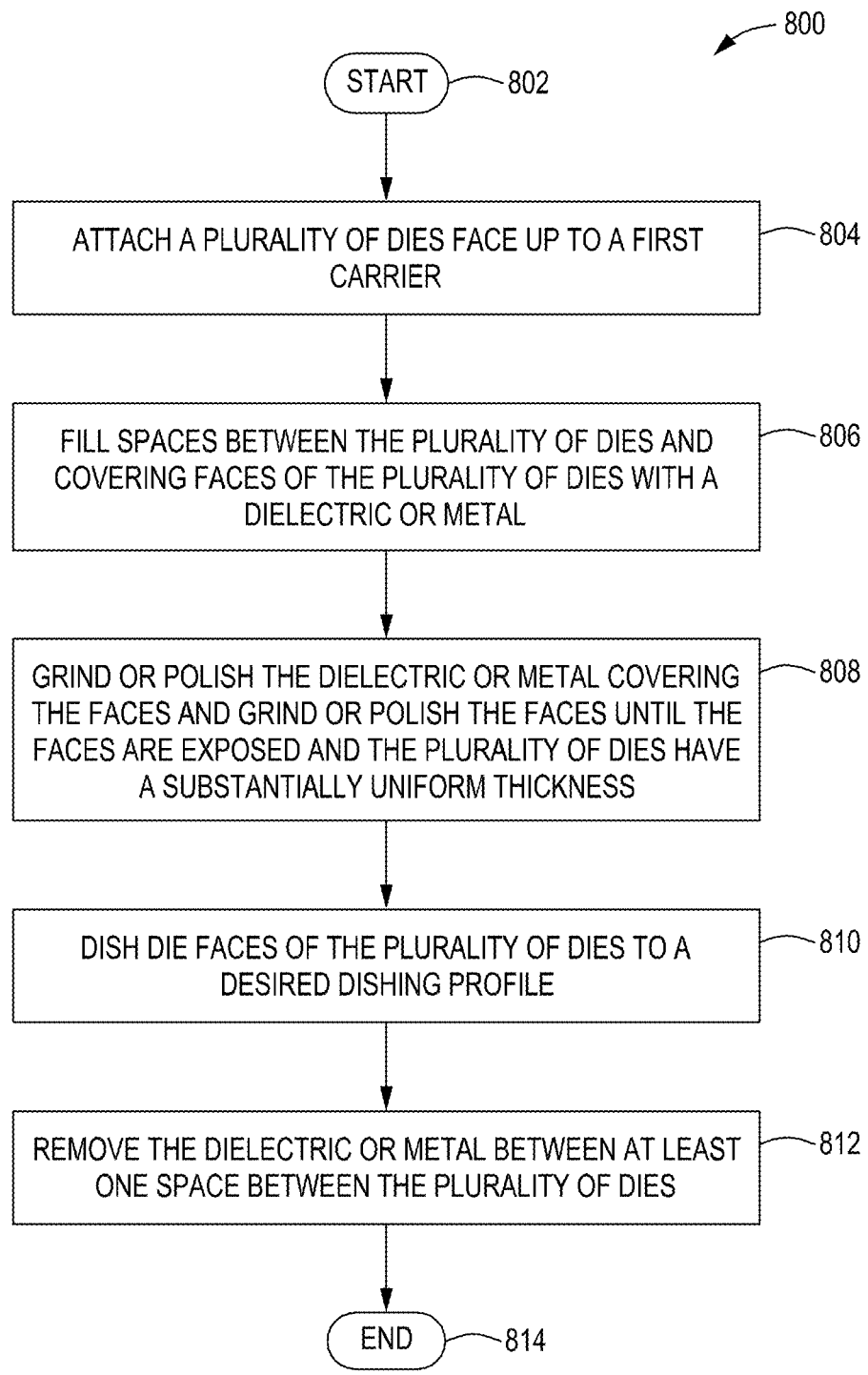
FIG. 8 is a flow diagram of a method of substrate processing in accordance with embodiments of the present disclosure.
Figure 9A:
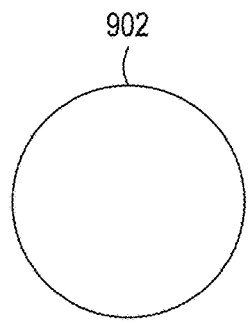
FIGS. 9A-9F include schematics illustrating steps of the method of FIG. 8.
Figure 9B:
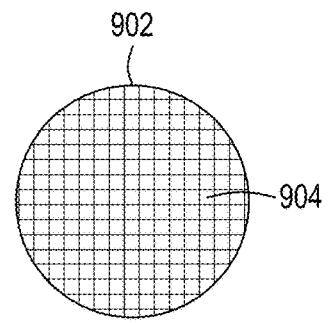

FIG. 8 is a flow diagram of another method 800 of substrate processing in accordance with embodiments of the present disclosure. In some embodiments the method may start at 802 by providing one or more substrates 902, sorting the substrates, and dicing the substrates 902 into singulated dies 904 as shown, for example, at FIGS. 9A and 9B.

Figure 9C:
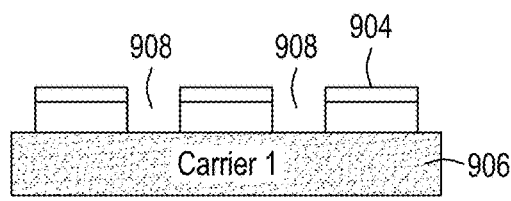

In some embodiments, at 804 a plurality of dies 904 may be attached face up to a first carrier 906, as shown for example in FIG. 9C. In some embodiments, the plurality of dies 904 attached to the first carrier 906 may include dies singulated from different substrates 902. In some embodiments, the plurality of dies 904 attached to the first carrier 906 may be from the same substrate 902. In some embodiments, the first carrier 906 may be made of silicon or glass and the plurality of dies 904 may be adhesively attached to the first carrier 906. The plurality of dies 904 may be spaced horizontally from one another on the first carrier 906 forming spaces 908 between the dies 904, as shown, for example in FIG. 9C.

Figure 9D:
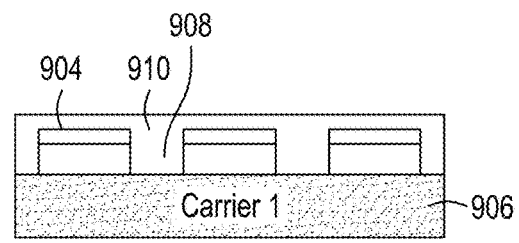

In some embodiments, at 806 the spaces 908 between the plurality of dies 904 may be filled with a dielectric or metal 910 and die faces 916 of the plurality of dies 904 may be covered with the dielectric or metal 910, as shown for example in FIG. 9D. In some embodiments, such filling may include molding, depositing, or coating the dielectric or metal 910. Also, in some embodiments, the dielectric 910 may include at least one of a polymer, an oxide, or a nitride.

Figure 9E:
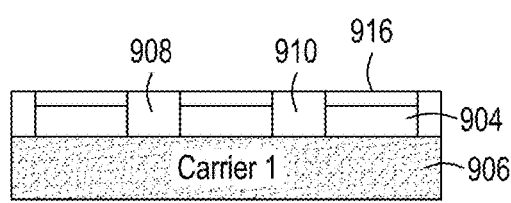
Figure 9F:
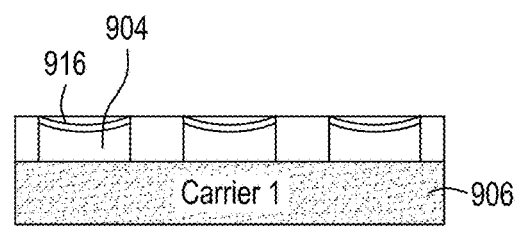

In some embodiments, at 808 the dielectric or metal 910 covering the die faces 916 of the plurality of dies 904 may be ground or polished and the die faces 916 of the plurality of dies 904 may be ground or polished until the die faces 916 are exposed and the plurality of dies 904 have a substantially uniform thickness, as shown for example at FIG. 9E. In some embodiments, at 810 the die faces of the plurality of dies 904 may be dished to a desired dishing profile to prepare the plurality of dies 904 for attachment, such as by hybrid bonding. The plurality of dies 904 may be dished in a CMP process to achieve the desired dishing profile, as shown for example at FIG. 9F. After dishing the plurality of dies 904, at 812 dielectric or metal 910 may be removed from at least one space 908 between the plurality of dies 904, as described above with respect to FIGS. 4 and 5. The method 800 may end at 814 whereupon further processing may take place, such as hybrid bonding the plurality of dies 904 as described above with respect to FIGS. 4 to 7.

In comparison to method 200, the method 800 may includes fewer process steps. However, because grinding or polishing occurs to the die faces 916 (rather than back sides of the dies 904) of the plurality of dies 904, an initial thickness variation between the plurality of dies 904 before grinding or polishing must be tightly controlled to avoid a large thickness variation in the die faces 916 upon CMP processing. On the other hand, the method 200 polishes and grinds the back sides 312 of the plurality of dies 304 so that there is less chance of a thickness variation in the thickness of the die faces 316 upon CMP processing. Thus, the method 800 may be useful for processing singulated dies having similar thicknesses, such as dies that originate from the same substrate.

While the foregoing is directed to embodiments of the present disclosure, other and further embodiments of the disclosure may be devised without departing from the basic scope thereof.

The invention claimed is:

1. A method of substrate processing, comprising:
    attaching a plurality of dies to a first carrier, wherein each die has a first side and a second side opposite the first side, wherein the first side is attached to the first carrier and wherein the plurality of dies are spaced horizontally from one another on the first carrier;
    filling spaces between the plurality of dies and covering the second sides and periphery of the plurality of dies with a dielectric or metal so that only the dielectric or metal surrounds the plurality of dies;
    grinding or polishing the dielectric or metal covering the second sides and grinding or polishing the second sides until the second sides are exposed and the plurality of dies have a substantially uniform thickness; and
    after grinding or polishing, dishing die faces of the plurality of dies to a desired dishing profile.

2. The method of claim 1, wherein the die faces are on the first side of the plurality of dies.

3. The method of claim 2, further comprising after grinding or polishing, attaching a second carrier to the second sides of the plurality of dies and detaching the first carrier, exposing the die faces on the first sides of the plurality of dies for dishing.

4. The method of claim 1, wherein the die faces are on the second sides of the plurality of dies.

5. The method of claim 1, further comprising, after dishing die faces, removing the dielectric or metal between at least one space between the plurality of dies.

6. The method of claim 1, further comprising, after dishing die faces, removing the dielectric or metal between all of the spaces between the plurality of dies.

7. The method of claim 1, wherein the filling includes molding, depositing, or coating the dielectric or metal.

8. The method of claim 1, wherein the dielectric includes a polymer, an oxide, or a nitride.

9. The method of claim 1, wherein the plurality of dies includes dies singulated from different substrates.

10. The method of claim 1, further comprising hybrid bonding the plurality of dies to a substrate.

11. A method of substrate processing, comprising:
    attaching a plurality of dies face down to a first carrier, and wherein the plurality of dies are spaced horizontally from one another on the first carrier;
    filling spaces between the plurality of dies and covering back sides and periphery of the plurality of dies with a dielectric or metal so that only the dielectric or metal surrounds the plurality of dies;
    grinding or polishing the dielectric or metal covering the back sides of the plurality of dies and grinding or polishing the back sides of the plurality of dies until the back sides are exposed and the plurality of dies have a substantially uniform thickness;
    after grinding or polishing, attaching a second carrier to the back sides of the plurality of dies and detaching the first carrier exposing the die faces of the plurality of dies;
    dishing the die faces of the plurality of dies to a desired dishing profile; and
    after dishing the die faces, removing the dielectric or metal between at least one space between the plurality of dies.

12. The method of claim 11, further comprising, after dishing, removing the dielectric or metal between all of the spaces between the plurality of dies.

13. The method of claim 11, wherein the filling includes molding, depositing, or coating the dielectric or metal.

14. The method of claim 11, wherein the dielectric includes a polymer, an oxide, or a nitride.

15. The method of claim 11, further comprising hybrid bonding the plurality of dies to a substrate.

16. A method of substrate processing, comprising:
    attaching a plurality of dies face up to a first carrier, and wherein the plurality of dies are spaced horizontally from one another on the first carrier;
    filling spaces between the plurality of dies and covering faces and periphery of the plurality of dies with a dielectric or metal so that only the dielectric or metal surrounds the plurality of dies;
    grinding or polishing the dielectric or metal covering the die faces of the plurality of dies and grinding or polishing the die faces of the plurality of dies until the die faces are exposed and all of the dies have a substantially uniform thickness;

after grinding or polishing, dishing the die faces of the plurality of dies to a desired dishing profile; and after dishing the die faces, removing the dielectric or metal between at least one space between the plurality of dies.

17. The method of claim 16, further comprising, after dishing, removing the dielectric or metal between all of the spaces between the plurality of dies.

18. The method of claim 16, wherein the filling includes molding, depositing, or coating the dielectric or metal.

19. The method of claim 16, wherein the dielectric includes a polymer, an oxide, or a nitride.

20. The method of claim 16, further comprising hybrid bonding the plurality of dies to a substrate.

\* \* \* \* \*